United States Patent [19]

Takagi et al.

[11] Patent Number: 5,388,105
[45] Date of Patent: Feb. 7, 1995

[54] METHOD OF RECORDING/REPRODUCING OPTICAL DISK DATA

[75] Inventors: Yuji Takagi, Kadoma; Isao Satoh, Neyagawa; Yuzuru Kuroki, Sapporo, all of Japan

[73] Assignee: Matsushita Electric Industrial Co., Ltd., Osaka, Japan

[21] Appl. No.: 980,438

[22] Filed: Nov. 23, 1992

Related U.S. Application Data

[63] Continuation of Ser. No. 518,497, May 3, 1990, abandoned.

[30] Foreign Application Priority Data

May 11, 1989 [JP] Japan ................ 1-118002

[51] Int. Cl.[6] .................. G06F 11/10; H03M 13/00
[52] U.S. Cl. .................. 371/37.7; 371/10.2; 369/44.32
[58] Field of Search ........... 371/37.7, 37.4, 67.1, 371/68.1, 68.2, 68.3, 69.1, 70, 71, 25.1, 5.5, 14, 10.1, 10.2, 21.1, 21.2, 40.1, 40.4; 369/53-58, 44.32

[56] References Cited

U.S. PATENT DOCUMENTS

| | | | |
|---|---|---|---|
| 4,467,373 | 8/1984 | Taylor et al. | 371/37.7 X |
| 4,821,254 | 4/1989 | Satoh et al. | 369/54 |
| 4,889,979 | 12/1989 | Drexler et al. | 369/54 X |
| 4,912,695 | 3/1990 | Senshu | 371/40.4 |
| 4,949,311 | 8/1990 | Barnard | 369/54 |
| 4,984,230 | 1/1991 | Satoh et al. | 369/54 |

Primary Examiner—Charles E. Atkinson
Assistant Examiner—Ly V. Hua
Attorney, Agent, or Firm—Stevens, Davis, Miller & Mosher

[57] ABSTRACT

A method of recording and reproducing data on and from a rewritable optical disk used for recording/reproduction of data on a sector by sector basis. A dummy block or a parity subject to error detection and correction coding is additionally recorded at the rear of a data block on a sector. A defect caused by deterioration due to reiterative operation at the trail of the sector can be prevented from reaching the data block and data can be reproduced with high reliability.

6 Claims, 7 Drawing Sheets

METHOD OF RECORDING/REPRODUCING OPTICAL DISK DATA

This application is a continuation of application Ser. No. 07/518,497, filed May 3, 1990, (abandoned).

BACKGROUND OF THE INVENTION

1. Field of the Invention

This invention relates to a method of recording and reproducing data on and from a rewritable optical disk on a sector-by-sector basis.

2. Description of the Prior Art

To meet requirements of high-density recording on a track, writing/erasing in units of sectors and the like, optically detectable guide tracks are formed concentrically or spirally on the optical disk, and a laser beam so focused as to have a diameter of 1 μm or less is irradiated on a recording layer formed on a guide track to record information in the form of pits or a change in reflectance or transmittance.

In cases where digital information of variable data length is recorded, a track is divided into a plurality of sectors in order to increase recording efficiency so that recording/reproduction of information is carried out in units of 512 bytes or about 1K bytes. Each sector comprises an ID field containing track address and sector address information and a data field used for recording/reproduction of data.

Typically, a data format of data to be recorded on the data field has a sync-pattern signal block used to pull PLL (Phase Locked Loop) into synchronism, a data head identifying mark block standing for a sync signal which heads recorded data to identify the data head, a modulated data block and a resynchronization signal block for data word synchronization.

When recording data, an address information on an ID field of a target sector is read and data sets are recorded on a data field of the target sector at the timing of the address detection.

Incidentally, in cases where data is overwritten on a rewritable phase change optical disk, power of a semiconductor laser for generating a laser beam to be irradiated on the disk is typically controlled to be set to one of three levels of reproduction, erasing and recording modes. In the reproduction mode, a relatively low power beam which does not affect the phase structure of the recording film of the disk is irradiated on the disk and in the erasing and recording modes, a relatively high power beam sufficient to cause a phase change in crystalline/amorphous state is irradiated on the disk.

However, when data is overwritten reiteratively on one sector of the rewritable phase change optical disk, such a phenomenon occurs that the recording film is gradually deteriorated at the final portion of recorded data on a data field where the laser power for erasing/recording mode changes to that for reproduction mode, causing a defect which spreads forward from the final portion to give rise to an error in reproduction of the recorded data.

Figure 7:
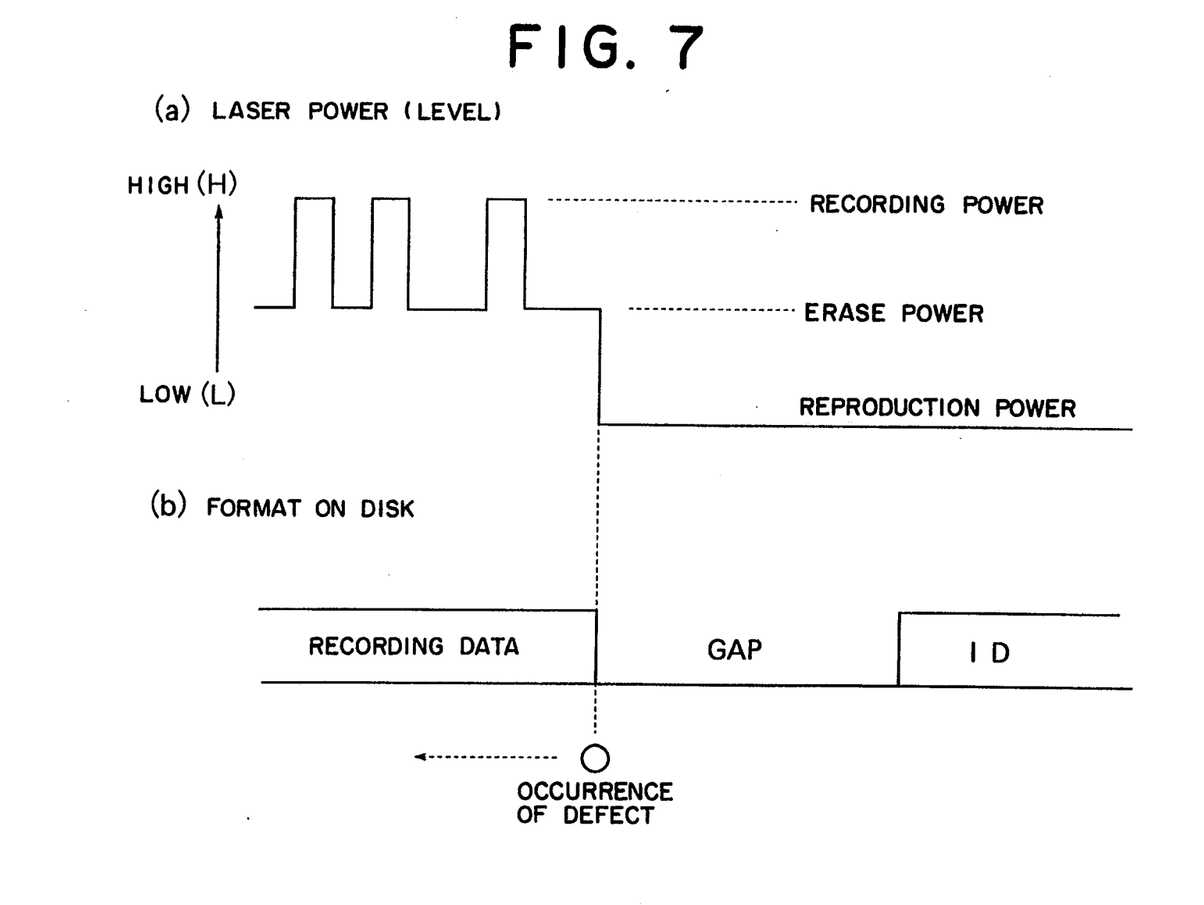
FIG. 7 is a diagram useful to explain the spreading of a defect from the final portion of a sector of an optical disk.

FIG. 7 illustrates at section (a) laser power levels at the final portion of the sector and at section (b) a recording format on the disk. As shown at (a) in FIG. 7, a beam of recording power or erasing power is irradiated, without exception, on the data recording block and a beam of reproduction power is irradiated, without exception, on the following gap and ID field.

Under this condition, a mechanism to be described below is considered to explain a cause of the aforementioned defect. Since the laser power for erasing/recording mode changes to that for reproduction mode at the same position on the final portion of the data recording block without exception, high thermal energy is generated owing to a phase change in the film occurring in the erasing/recording mode. This energy can not go over a thermal energy barrier at the following gap where only the low power beam for reproduction mode is irradiated, and the energy is accumulated in the final portion to deteriorate the recording film. In addition, the accumulated energy gradually migrates forward to spread the defect toward the trail of the recorded data. This phenomenon is a drawback inherent in so-called heat-mode recording.

SUMMARY OF THE INVENTION

In view of the above, an object of the present invention is to provide a method of recording/reproducing optical disk data, by which method data reproduction can be effected with high reliability by eliminating the influence of a defect which gradually spreads when data is reiteratively erased from and recorded on a phase change type rewritable optical disk.

According to the invention, to accomplish the above object a method of recording/reproducing optical disk data has a dummy block adding step of additionally recording a predetermined dummy block at the rear of an error detection and correction coded data block on individual sectors of an optical disk having a sector structure.

In accordance with the invention having the above construction, even when a defect caused by deterioration due to reiterative operation spreads from the trail of a sector, an error due to the defect can be prevented from affecting the data block and data can be reproduced with high reliability.

According to a preferred embodiment of the invention, a method of recording/reproducing optical disk data comprises a dummy block adding step of additionally recording a predetermined dummy block at the rear of an error detection and correction coded data block on individual sectors of an optical disk of a sector structure, and a dummy block comparing step of comparing a reproduction dummy block reproduced from the optical disk with the predetermined dummy block which should have normally been recorded, whereby when an error in excess of a predetermined criterion is detected in the dummy block comparing step upon reproduction, data on the sector is recorded on a substitute sector and thereafter a recording operation is carried out for the substitute sector.

In accordance with the construction of the embodiment, even when a defect caused by deterioration due to reiterative operation spreads from the trail of a sector, the dummy block added at the rear of the data block can prevent an error due to the defect from affecting the data block and besides, by comparing the reproduction dummy block with the dummy block which should have normally been recorded, the degree of deterioration due to reiterative operation can be monitored so that data on the sector may be transferred to and recorded on the substitute sector before the defect affects the data block, thereby ensuring highly reliable data reproduction.

According to another preferred embodiment of the invention a method of recording/reproducing optical disk data comprises a first coding step of causing data to undergo a first error detection and correction coding to form a data block, a second coding step of causing the data block to undergo a second error detection and correction coding, a parity adding step of additionally recording a parity subject to the second coding at the rear of the data block on the sector upon data recording, a first decoding step of decoding a signal subject to the first coding, and a second decoding step of decoding a signal subject to the second coding.

With this construction, even when a defect caused by deterioration due to reiterative operation spreads from the trail of the sector, the parity subject to the second coding added at the rear of the data block can prevent an error due to the defect from affecting the data block, and besides even when a lengthy error in data block occurs because of dust and the like and the error can not be corrected in the first decoding, the data block can be decoded in the second decoding to permit highly reliable data reproduction.

DESCRIPTION OF THE PREFERRED EMBODIMENTS

Figure 2:
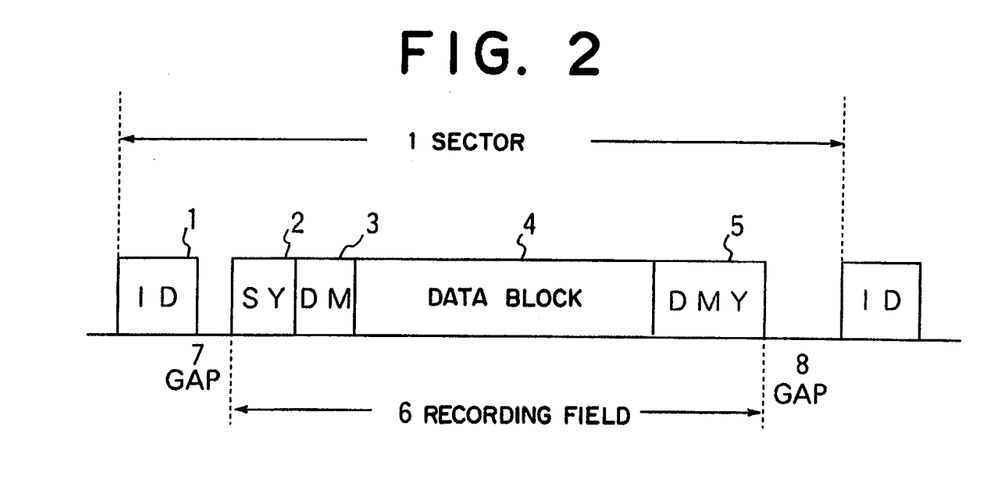
FIG. 2 is a diagram showing a recording format of an optical disk sector to be recorded with data in accordance with the embodiment shown in FIG. 1.

FIG. 2 shows a recording format of an optical disk sector to be recorded with data by an optical disk data recording/reproducing apparatus for implementation of an embodiment based on a first method according to the invention.

Referring to FIG. 2, reference numeral 1 designates an ID field recorded with address information for a sector, 2 a sync-pattern signal block SY used to pull PLL into synchronism, 3 a data head identifying mark block DM used to identify the head of recorded data, 4 an error detection and correction coded data block, and 5 a dummy block DMY recorded at the rear of the data block 4. A data recording field 6 of the sector consisting of the blocks 2, 3, 4 and 5 is used for recording/reproduction/erasing of data. With the aim of coping with inconvenience due to variations in rotation of the optical disk, a gap 7 is interposed between the recording field 6 and the ID field 1 of one sector and a gap 8 is interposed between the recording field 6 and an ID field of the following sector.

Figure 1:
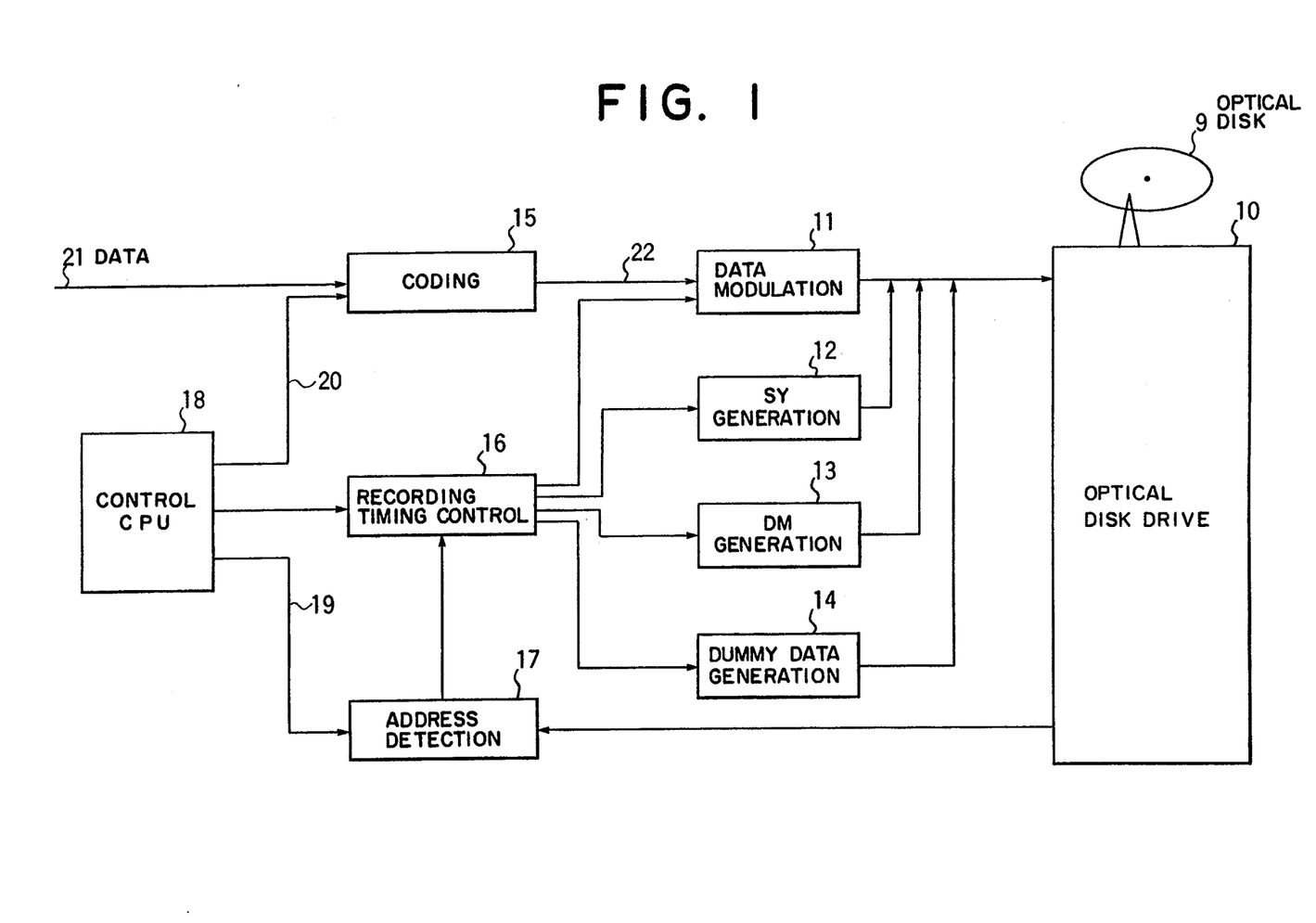
FIG. 1 is a block diagram showing the construction of an apparatus of recording/reproducing optical disk data used for implementing an embodiment based on a first method according to the invention.

The optical disk data recording/reproducing apparatus for implementation of the embodiment based on the first method of the invention has components for data recording as illustrated in FIG. 1 and operates to record data in the form of the recording format shown in FIG. 2.

Referring to FIG. 1, reference numeral 9 designates an optical disk, 10 an optical disk drive adapted to manage follow-up of guide tracks of the optical disk, irradiation of an output beam of semiconductor laser on the recording surface and recording/reproduction/erasing of data, 11 a data modulator circuit adapted to perform digital modulation of coded data into a form suitable for recording, 12 an SY signal generator circuit for generating a sync-pattern signal SY used to pull PLL into synchronism, 13 a DM signal generator circuit for generating a data head identifying signal, 14 a dummy data generator circuit for generating dummy data, 15 a coding circuit for error detection and correction coding of data, 16 a recording timing control circuit for controlling timings for recording, 17 an address detector circuit for detecting a target address from the ID field 1 of sector, and 18 a control CPU comprising of, for example, a microprocessor and operable to control the whole apparatus.

The optical disk data recording/reproducing apparatus for implementation of the embodiment based on the first method of the invention is constructed as described above and it operates as described below. When recording data, the control CPU 18 sends an address 19 of a target sector to be recorded with data to the address detector circuit 17. The control CPU 18 delivers a coding instruction 20 to the coding circuit 15 and sends a recording instruction to the recording timing control circuit 16. The coding circuit 15 performs an error detection and correction coding of data 21 and sends coded data to the data modulator circuit 11. The data modulator circuit 11 performs digital modulation of the coded data 22 and sends modulated data to the optical disk drive 10. The SY signal generator circuit 12 generates a sync-pattern signal and the DM signal generator circuit 13 generates a data head identifying signal DM. When the address detector circuit 17 detects the target sector, the recording timing control circuit 16 sends start instructions sequentially to the SY signal generator circuit 12. DM signal generator circuit 13, data modulator circuit 11 and dummy data generator circuit 14 so that data may be recorded on a recording field 6 of the sector.

When data is recorded repeatedly on each sector, a defect due to deterioration of the recording film occurs at the boundary between the dummy block DMY 5 and the gap 8 at the rear of the dummy block DMY 5 because power of the semiconductor laser is switched at the boundary without exception, and the defect gradually spreads forward from the final portion to migrate into the recording field 6. However, as described above, according to the first method of the present invention, dummy data can be recorded to follow the data block 4 as shown in FIG. 2, due to the dummy block DMY 5 recorded at the rear of the data block 4 on which data is actually recorded, so that the influence of the defect is confined within the dummy block DMY 5, not reaching the data block 4, and reliability of data reproduction can be insured.

Figure 3:
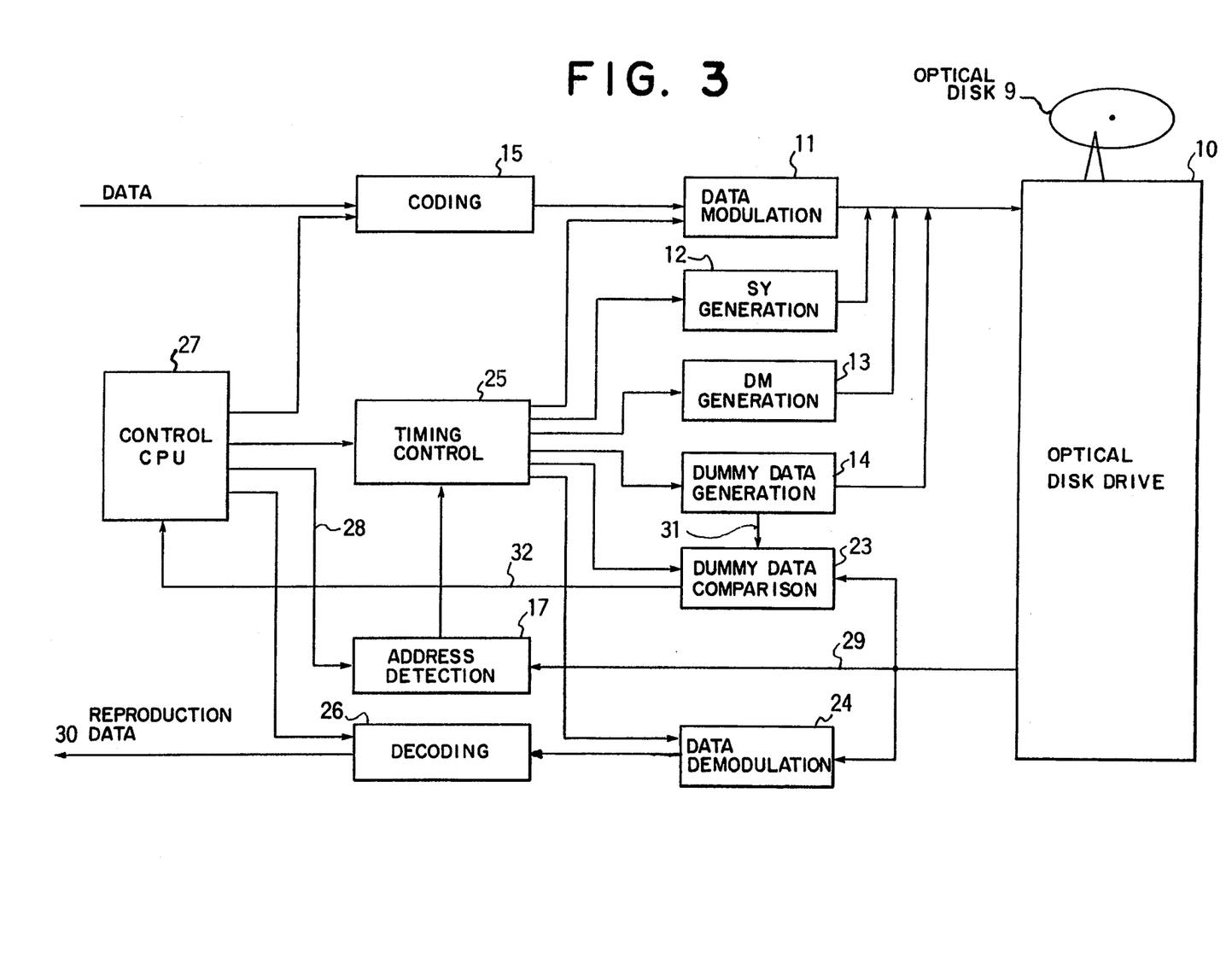
FIG. 3 is a block diagram showing the construction of an apparatus of recording/reproducing optical disk data used for implementing an embodiment based on a second method according to the invention.

An optical disk data recording/reproducing apparatus for implementation of an embodiment based on a second method of the invention is constructed as illustrated in FIG. 3. Components 9 to 15 and component 17 in FIG. 3 are identical to those in FIG. 2. Referring to FIG. 3, reference numeral 9 designates an optical disk, 10 an optical disk drive, 11 a data modulator circuit, 12 an SY signal generator circuit, 13 a DM signal generator circuit, 14 a dummy data generator circuit, 15 a coding circuit, 17 an address detector circuit, 23 a dummy data comparator circuit for comparing dummy data reproduced from the optical disk with dummy data which should have normally been recorded to detect that an error in excess of a criterion occurs, 24 a data demodulator circuit for demodulating the data which has been modulated, recorded and reproduced, 25 a timing control circuit for controlling timings for recording and reproducing, 26 a decoding circuit adapted to perform error detection and correction, and 27 a control CPU operable to control the whole of the optical disk data recording/reproducing apparatus.

The optical disk data recording/reproducing apparatus for implementation of the embodiment based on the second method of the invention is constructed as described above and it operates as described below.

When recording data, the control CPU 27 sends an address 28 of a target sector to be recorded with data to the address detector circuit 17 and also delivers recording instructions to the coding circuit 15 and timing control circuit 25. When the address of the target sector is detected, the timing control circuit 25 sends start signals sequentially to the SY signal generator circuit 12, DM signal generator circuit 13, data modulator circuit 11 and dummy data generator circuit 14 so that data may be recorded in the form of a recording format of sector similar to that shown in FIG. 2.

When reproducing data, the control CPU 27 sends an address 28 of a target sector from which data is to be reproduced to the address detector circuit 17. Also, the control CPU 27 sends a reproduction instruction to the timing control circuit 25. When the address of the target sector is detected by the address detector circuit 17, the timing control circuit 25 causes the data demodulator circuit 24 and dummy data comparator circuit 23 to start sequentially so that reproduction of data may be initiated. The data demodulator circuit 24 demodulates a reproduction signal 29 delivered out of the optical disk drive and sends a demodulated signal to the decoding circuit 26. The demodulated signal is subjected to error detection and correction in the decoding circuit 26 and delivered as reproduction data 30 to a host computer such as a personal computer. The dummy data comparator circuit 23 compares dummy data which has been recorded on the final portion of the sector with predetermined dummy data 31 which should have normally been recorded, and when detecting an error in excess of a criterion, it sends a dummy data error signal 32 to the control CPU 27. Receiving the dummy data error signal 32, the control CPU 27 determines that the degree of a defect caused by deterioration due to reiterative operation at the trail of the sector is aggravated, so that data on the sector is recorded on a new substitute sector.

Obviously, any desired data may be recorded as dummy data 31 at the final portion of the sector and when the dummy data 31 is "1, 0, 1, 1", the dummy data comparator circuit 23 may be constructed as a circuit capable of detecting an error of three bits or more. Such a comparator circuit is illustrated in FIG. 4.

Figure 4:
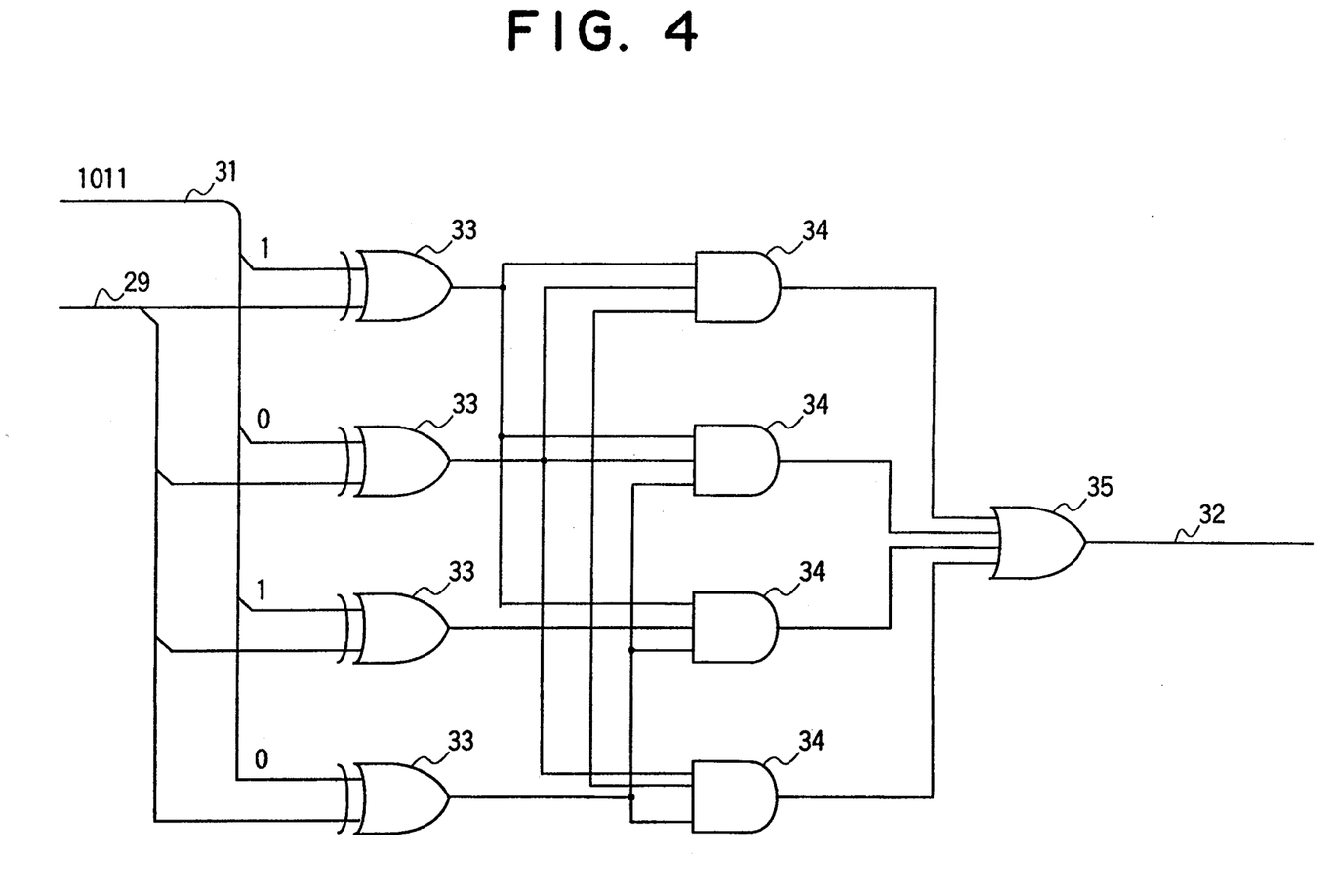
FIG. 4 is a circuit diagram of a dummy data comparator circuit used in the apparatus shown in FIG. 3.

In FIG. 4, reference numeral 33 designates exclusive OR gates, 34 AND gates and 35 an OR gate.

In the dummy data comparator circuit 23 constructed as above, the exclusive OR gates 33 receive, at one input terminal, an input signal representative of dummy data "1, 0, 1, 1" which should have normally been recorded on each sector. The exclusive OR gates 33 receive, at the other input terminal, dummy data reproduced from the reproduction signal 29 reproduced from the optical disk 9. When non-coincidence occurs in respective bits, the respective exclusive OR gates 33 delivers "1". Then, output signals from the respective AND gates 34 are OR-ed in the OR gate 35, which in turn delivers an output signal 32 of "1" when non-coincidence is detected in at least three bits. The output signal 32 is sent as a dummy data error signal to the control CPU 27.

As described above, by using the dummy data comparator circuit 23 as shown in FIG. 4, an error in excess of a predetermined criterion, in this example, an error of three bits or more, can be detected from the dummy data. It will be appreciated that the contents and length of dummy data and the criterion can obviously be set to desired values.

When data is recorded repeatedly on each sector, a defect due to deterioration of the recording film occurs at the boundary between the DMY block 5 and the gap 8 at the rear of the DMY block 5 because power of the semiconductor laser is switched at the boundary without exception, and the defect gradually spreads forward from the final portion to migrate into the recording field 6. However, as described above, according to the second method of the present invention, dummy data can be recorded to follow the data block 4, due to the dummy block DM 5 recorded at the rear of the data block 4 on which data is actually recorded, so that the influence of the defect is confined within the dummy block 5, not reaching the data block 4, and reliability of data reproduction can be insured. In addition, even in the event that the defect spreads through the dummy block DM 5, the error state of the dummy block DM 5 can be monitored so that data may be transferred to a substitute sector, thereby further promoting reliability.

Figure 5:
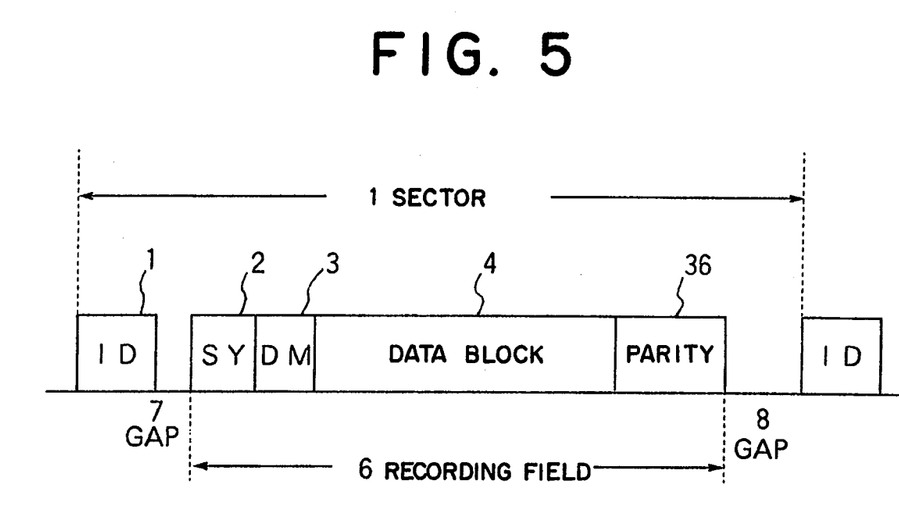
FIG. 5 is a diagram showing a recording format of an optical disk sector to be recorded with data by an apparatus of recording/reproducing optical disk data used for implementing an embodiment based on a third method according to the invention.
Figure 6:
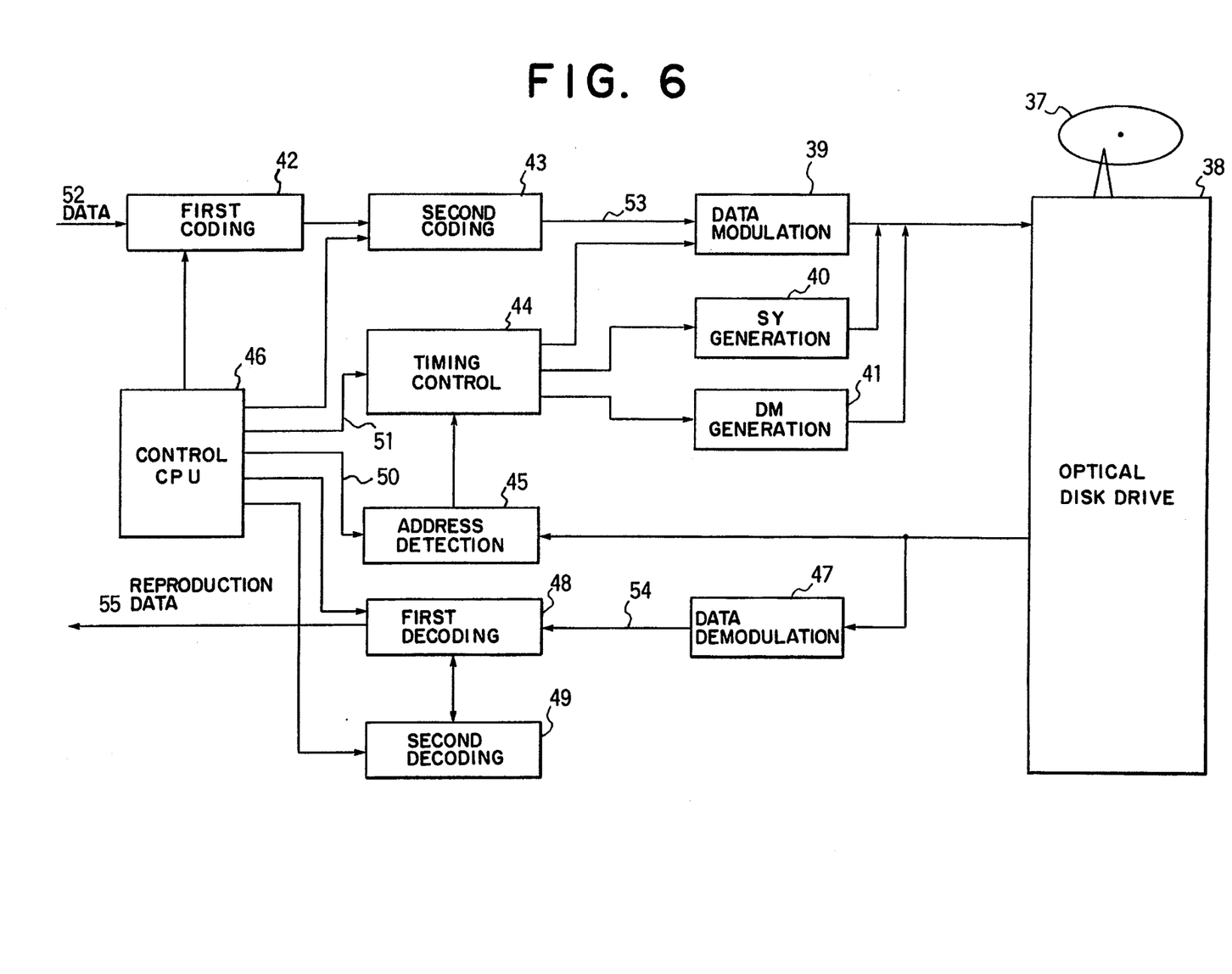
FIG. 6 is a block diagram showing the construction of the optical disk data recording/reproducing apparatus used for implementation of the embodiment based on the third method of the invention.

FIG. 5 shows a recording format of an optical disk sector to be recorded with data by an optical disk data recording/reproducing apparatus, as shown in FIG. 6, for implementation of an embodiment based on a third method according to the invention.

Referring to FIG. 5, reference numerals 1 to 4 and 6 to 8 designate identical elements to those of the recording format shown in FIG. 2, with the reference numeral 1 denoting an ID field recorded with address information, 2 a sync-pattern signal block SY, 3 a data head identifying mark block DM, 4 a data block, 6 a recording field, and 7, 8 gaps. Denoted by 36 is a parity subject to a second error detection and correction coding of data.

The optical disk data recording/reproducing apparatus for implementation of the embodiment based on the third method of the invention is constructed as illustrated in FIG. 6 and operates to record data in the form of the recording format shown in FIG. 5.

Referring to FIG. 6, reference numeral 37 designates an optical disk, 38 an optical disk drive adapted to manage follow-up of guide tracks of the optical disk, irradiation of an output beam of semiconductor laser on the recording surface and recording/reproduction/erasing of data, 39 a data modulator circuit adapted to perform digital modulation of coded data into a form suitable for recording, 40 an SY signal generator circuit for generating a sync-pattern signal used to pull PLL into synchronism, 41 a DM signal generator circuit for generating a data head identifying signal, 42 a first coding circuit for a first error detection and correction coding of data, 43 a second coding circuit for an additional second error detection and correction coding of the whole data block 4 subjected to the first coding, 44 a timing control circuit for controlling timing, 45 an address detector circuit for detecting a target address from the ID field 1 of the sector, 46 a control CPU comprising, for example, a microprocessor and operable to control the whole apparatus, 47 a data demodulator circuit for demodulating a reproduction signal, 48 a first decoding circuit for decoding a first error detection and correction code, and 48 a second decoding circuit for decoding a second error detection and correction code.

The optical disk data recording/reproducing apparatus for implementation of the embodiment based on the third method of the invention is constructed as described above and it operates as described below.

When recording data, the control CPU 46 sends an address 50 of a target sector to be recorded with data to the address detector circuit 45. Also, the control CPU 46 delivers coding instructions to the first and second coding circuits 42 and 43 and a recording instruction 51 to the timing control circuit 44. The first coding circuit 42 performs a first coding for error detection and correction of data 52 and sends coded data to the second coding circuit 43. The second coding circuit 43 adds a parity subject to the second error detection and correction coding to the whole data subject to the first coding and sends coded data to the data modulator circuit 39. The data modulator circuit 39 performs digital modulation of the coded data 53 and sends modulated data to the optical disk drive 38. The SY signal generator 40 generates a sync-pattern signal and the DM signal generator 41 generates a data head identifying signal. When the address detector circuit 45 detects the target sector, the timing control circuit 44 sends start instructions sequentially to the SY signal generator circuit 40, DM signal generator circuit 41 and data modulator circuit 39 so that data may be recorded on a recording field 6 of the sector. Through the above recording operation, data can be recorded in the form of the recording format shown in FIG. 7.

Reproduction of data will now be described. When reproducing, the control CPU 46 sends an address 50 of a target sector from which data is to be reproduced to the address detector circuit 45 and a reproduction instruction to the timing control circuit 44. When the address of the target sector is detected by the address detector circuit 45, the timing control circuit 44 causes the data demodulator circuit 47 to start so that reproduction of data may be initiated. When the data head identifying signal DM 3 is detected, the data demodulator circuit 47 initiates demodulation of the ensuing reproduction signal. The first decoding circuit 48 performs error detection and correction of demodulated data 54 delivered out of the data demodulator circuit 47 to provide reproduction data 55 which in turn is supplied to a host computer. Thus, the first code ends with the data block 4 and at the rear thereof, the parity subject to the second coding is recorded. Therefore, the data block 4 will not be affected by an error occurring when a defect caused by deterioration due to reiterative operation spreads and high reliability can be obtained. In normal operation, large dust particles and the like accidentally cause an error in demodulated data. Such trouble occurs frequently and invalidates error correction by the first decoding circuit 48. In such an event, error correction can be effected using the second decoding circuit 49.

As described above, according to the third method of the present invention, the parity subject to the second coding can be added to follow the data block subject to the first coding. Therefore, the signal subject to the first coding can be decoded without being affected by an error occurring when a defect caused by deterioration due to reiterative operation spreads. In addition, the added data is the parity subject to the second coding, and by decoding the signal subject to the second coding by using the parity, highly reliable data reproduction can be insured.

We claim:

1. A method of recording data on each sector of a rewritable phase change optical disk having a plurality of sectors by a semiconductor laser having optical power in at least three variable modes including a recording mode, an erasing mode and a reproducing mode, said method comprising:
  (a) coding data to be recorded in accordance with an error detection and correction code to provide an error detection and correction coded data block;
  (b) providing a dummy data block having a predetermined signal with a predetermined signal length and appending said dummy data block to a rear end of said data block; and
  (c) recording said data block and said dummy data block on an individual sector of said plurality of sectors so that a location where a level of said optical power changes from said recording or erasing mode to said reproducing mode at a rear end of said individual sector is separated from said data block by a distance corresponding to said predetermined signal length of said dummy block, thereby preventing a defect generated at said location from affecting said data block.

2. A method according to claim 1, wherein said predetermined signal of said dummy data block is predetermined independently of said data to be recorded.

3. A method of recording and reproducing data on and from each sector of a rewritable phase change optical disk having a plurality of sectors by a semiconductor laser having optical power in at least three variable modes including a recording mode, an erasing mode and a reproducing mode, respectively, said method comprising:
  (a) coding data to be recorded in accordance with an error detection and correction code to provide an error detection and correction coded data block;
  (b) providing a dummy data block having a predetermined signal with a predetermined signal length and appending said dummy data block to a rear end of said data block;
  (c) recording said data block and said dummy data block on an individual sector of said plurality of sectors so that a location where a level of said optical power changes from said recording or erasing mode to said reproducing mode at a rear end of said individual sector is separated from said data block by a distance corresponding to said predetermined signal length of said dummy block, thereby preventing a defect generated at said location from affecting said data block;

(d) reproducing said dummy data from said individual sector;

(e) comparing said dummy data reproduced in step (d) with predetermined dummy data to detect whether an error exceeding a predetermined criterion exists in said dummy data stored on said individual sector resulting from deterioration of said optical disk due to repetitive recording;

(f) designating a substitute sector among said plurality of sectors for said individual sector when a said error exceeding said predetermined criterion is detected in step (e); and (g) thereafter performing a recording/reproducing operation on said substitute sector in accordance with steps (a)–(f).

4. A method according to claim 3, wherein said predetermined signal of said dummy data block is predetermined independently of said data to be recorded.

5. A method according to claim 3, wherein step (e) comprises:

(i) comparing bit-by-bit said dummy data reproduced in step (d) with said predetermined dummy data;

(ii) determining a number of bits by which said dummy data reproduced in step (d) differ from said predetermined dummy data; and (iii) comparing said number of bits with said predetermined criterion.

6. A method of recording and reproducing original data on and from each sector of a rewritable phase change optical disk having a plurality of sectors by a semiconductor laser having optical power in at least three variable modes including a recording mode, an erasing mode and a reproducing mode, respectively, said method comprising:

(a) coding original data to be recorded in accordance with a first error detection and correction code to provide an error detection and correction coded data block;

(b) coding said data block in accordance with a second error detection and correction code to provide parity data;

(c) appending said parity data to a rear end of said data block;

(d) recording said data block and said parity data on an individual sector of said plurality of sectors so that a location where a level of said optical power changes from said recording or erasing mode to said reproducing mode at a rear end of said individual sector is separated from said data block by a distance corresponding to a length of said parity data, thereby preventing a defect generated at said location from affecting said data block;

(e) reproducing said data block and said parity data from said individual sector;

(f) decoding said first error detection and correction code from said data block reproduced in step (e);

(g) decoding said second error detection and correction code from said parity data reproduced in step (e) when said first error detection and correction code cannot be correctly decoded in step (f); and (h) reproducing said original data by utilizing said first error detection and correction code decoded in step (f) or said second error detection and correction code decoded in step (g).

* * * * *